(12) United States Patent
Kim et al.

(10) Patent No.: US 6,777,944 B2
(45) Date of Patent: Aug. 17, 2004

(54) SYSTEM FOR MEASURING BATTERY CURRENT FOR ELECTRIC VEHICLE

(75) Inventors: Jin-Gon Kim, Hwaseong (KR); Sun-Soon Park, Hwaseong (KR)

(73) Assignee: Hyundai Motor Company, Seoul (KR)

( * ) Notice: Subject to any disclaimer, the term of this patent is extended or adjusted under 35 U.S.C. 154(b) by 0 days.

(21) Appl. No.: 10/306,654

(22) Filed: Nov. 26, 2002

(65) Prior Publication Data

US 2003/0169048 A1 Sep. 11, 2003

(30) Foreign Application Priority Data

Mar. 6, 2002 (KR) .................................. 2002-0011933

(51) Int. Cl.[7] .......................................... G01N 27/416
(52) U.S. Cl. ..................................................... 324/426
(58) Field of Search ................................ 324/426, 429, 324/772; 320/104, 134; 322/28; 702/58, 59, 64–66, 75, 76, 183, 189, 190; 318/638, 700, 720–724

(56) References Cited

U.S. PATENT DOCUMENTS

| | | | |
|---|---|---|---|
| 4,266,189 A | 5/1981 | Karlin et al. | ................ 324/117 |
| 6,456,946 B1 * | 9/2002 | O'Gorman | .................... 702/58 |
| 6,466,025 B1 * | 10/2002 | Klang | ......................... 324/429 |
| 6,515,446 B1 * | 2/2003 | Koide et al. | ................ 318/700 |

FOREIGN PATENT DOCUMENTS

CN          1261174          7/2000

* cited by examiner

Primary Examiner—Pia Tibbits
(74) Attorney, Agent, or Firm—Morgan Lewis & Bockius LLP

(57) ABSTRACT

A system for measuring a current of a battery for an electric vehicle includes a current transducer, a voltage-to-PWM (PWM (Pulse Width Modulation) converter, and a power supply unit. The current transducer measures a battery current during a charge or a discharge of the battery, and generates a corresponding voltage signal. The voltage-to-PWM converter converts the voltage signal input generated by the current transducer to a PWM signal. The power supply unit supplies power to the current transducer.

10 Claims, 1 Drawing Sheet

SYSTEM FOR MEASURING BATTERY CURRENT FOR ELECTRIC VEHICLE

FIELD OF THE INVENTION

The present invention relates to a current measuring system, and more particularly, to a current measuring system for a battery system of an electric vehicle.

BACKGROUND OF THE INVENTION

Generally, an electric vehicle uses a battery as an energy storage device. In particular, a general electric vehicle uses multiple 12V battery modules connected in series, in order to establish a relatively high voltage. The number of battery modules used is determined by the voltage requirements of the vehicle, which generally averages between 250V and 350V. To obtain these voltage levels using 12V batteries, about 20–30 battery modules must be connected in series.

In electric vehicles, in order to provide enough power to move the vehicle, a battery must provide 200 to 500A of current at the voltage range stated above. To charge the battery, a current of between 10 and 100A is used.

Methods for measuring battery current in general electric vehicles include:

1. a current-measuring method using a shunt resistor;
2. a current-measuring method using an open-loop Hall sensor; and
3. a current-measuring method using a closed-loop Hall sensor.

While the sensors used by the open- and closed-loop Hall sensor methods are different than the sensor of the shunt-resistor method, the overall circuits and methods are similar.

The shunt-resistor method uses a simple and cheap sensor, but its drawbacks include measuring errors and a low stability. This technique is also very sensitive to electrical noise and mechanical interference. Therefore, this technique is not practical for use in electric vehicles.

In contrast, the sensors used in the open- and closed-loop Hall sensor methods are more expensive than the sensor used in the shunt-resistor method, but they are more accurate and have more advantages than the sensor of the shunt-resistor method.

The closed-loop Hall sensor method is commonly used in electric vehicles because its sensor has less noise sensitivity than the open-loop Hall sensor method. However, the closed-loop Hall sensor is very expensive.

In a current-measuring system using a closed-loop Hall sensor, the current measuring system may include an electronic control unit for a battery management system (hereinafter referred to as a BMS ECU), and a sensor for measuring the current (e.g., a current transducer), installed outside the BMS ECU. The characteristics of the external current transducer need to be considered when designing the BMS ECU. Also, when the current sensor is changed, the BMS ECU must also be changed.

In this system, the current transducer utilizes a closed-loop Hall effect current sensor to reduce electrical noise effects. The closed-loop Hall sensor generates a current with a density that is proportional to a density of the measured current. For this reason, the current transducer needs both a positive and a negative power source.

The BMS ECU in this system may include a voltage follower, a reference adjuster, and an analog-to-digital converter (hereinafter referred to as an A/D converter). The voltage follower acts as a buffer in order to cancel out measurement errors caused by impedance changes of the measured circuit. The reference adjuster amplifies an input voltage to a reference voltage when converting an analog signal to a digital signal, because the measured value of the closed loop sensor may be a positive voltage or a negative voltage, according to current direction. The A/D converter performs an analog-to-digital conversion of the measured current.

This type of system has several disadvantages, including:

1. The circuit of the BMS ECU must match the type of the current transducer (i.e., if one is changed, the other must be changed).
2. The BMS ECU can have a complex structure, including a buffer for sensing a current, a voltage distributor, and an A/D converter.
3. The circuitry for the BMS ECU can also be complex because the power for the current transducer is supplied by the BMS ECU.
4. The current transducer must utilize an expensive closed-loop Hall sensor because the system is sensitive to electrical noise.
5. The current-measuring system is not adaptable to other control units of the electrical vehicle.

SUMMARY OF THE INVENTION

In a preferred embodiment of the present invention, a system for measuring a current of a battery for an electric vehicle includes a current transducer, a voltage to Pulse Width Modulation (PWM) converter, and a power supply unit. The current transducer measures current during charge or discharge, and outputs a corresponding voltage signal. The voltage to PWM converter converts the voltage signal generated by the current transducer to a PWM signal. The power supply unit supplies power to the current transducer.

In one preferred embodiment, the current transducer is an open-loop Hall effect current sensor. Also, preferably, the voltage to PWM converter and power supply unit is formed as a hybrid Integrated Circuit (IC) chip, and the chip is installed inside the current transducer.

In another preferred embodiment of the present invention, the voltage to PWM converter includes a triangle wave generator, a voltage level detector, and an open-collector transistor circuit. The triangle wave generator generates a triangle wave. The voltage level detector generates a PWM signal by comparing the voltage signal generated by the current transducer to the triangle wave input from the triangle wave generator. The open collector transistor circuit transmits the PWM signal to other control units.

Preferably, the voltage to PWM converter further includes a voltage follower for preventing the voltage signal of the current transducer from being distorted by a change of impedance of the current transducer, and for transmitting the voltage signal generated by the current transducer to the voltage level detector.

In another preferred embodiment of the present invention, the power supply unit comprises a DC/DC converter for converting a power level to the level that is used in the current transducer, and for supplying the converted power to the current transducer.

In yet another preferred embodiment, a system for measuring a current of a battery for an electric vehicle includes a current level detector, an analog-to-digital waveform converter, and a power supply unit. The current level detector measures battery current during charging and discharging states of the battery, and generates a corresponding voltage signal, using substantially unipolar power. The analog-to-digital waveform converter converts the voltage signal generated by the current transducer to a substantially digital waveform, and the power supply unit supplies unipolar power to the current transducer.

Preferably, the current level detector is an open-loop Hall effect current sensor, and the analog-to-digital waveform converter is a voltage-to-PWM converter. Also, in another preferred embodiment, the system further includes an open-collector transistor circuit for transmitting the substantially digital waveform to other control units.

BRIEF DESCRIPTION OF THE DRAWINGS

The accompanying drawings, which are incorporated in and constitute a part of the specification, illustrate an embodiment of the invention, and, together with the description, serve to explain the principles of the invention, where.

DETAILED DESCRIPTION OF THE PREFERRED EMBODIMENTS

Figure 1:
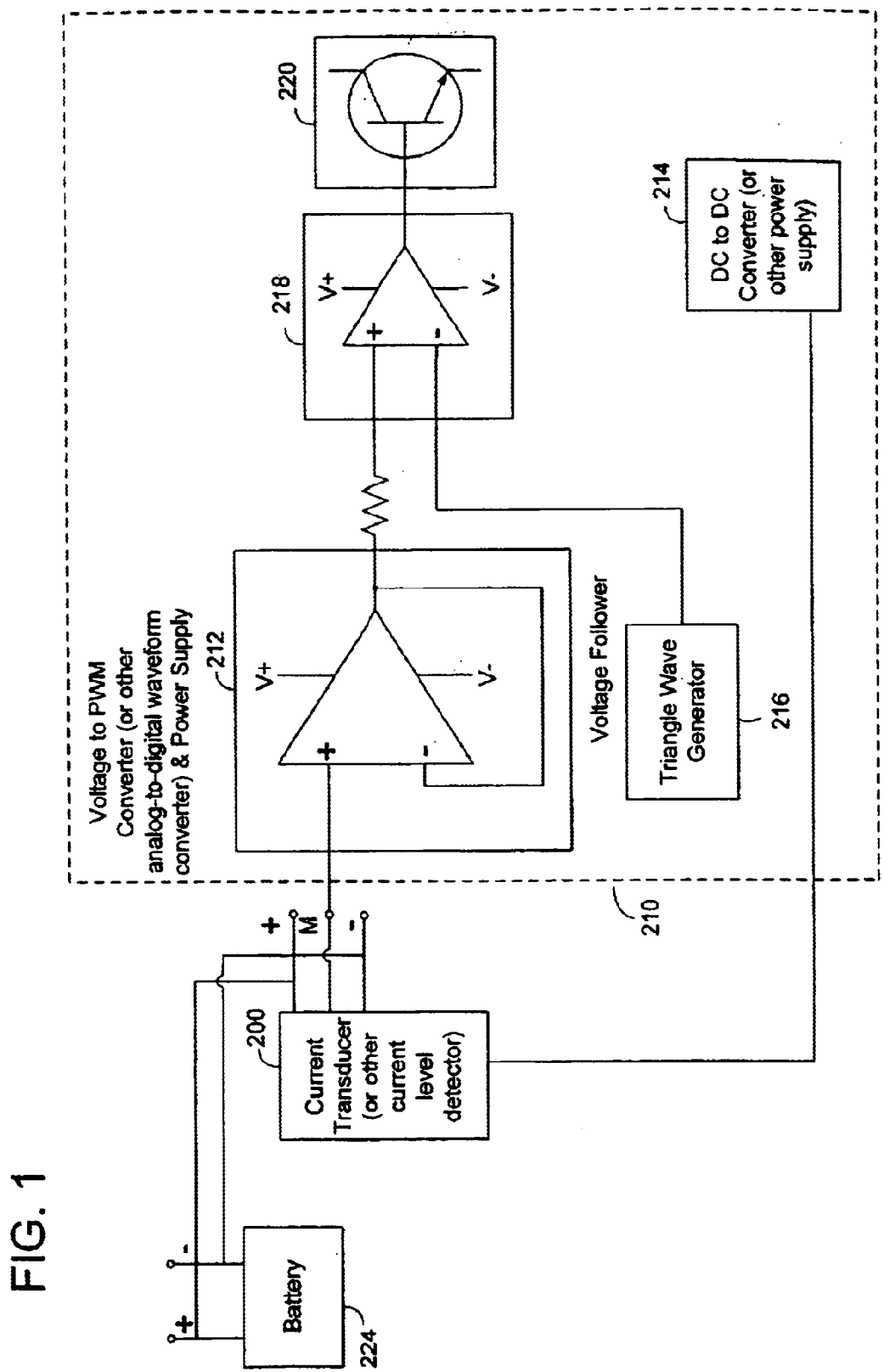
FIG. 1 is a block diagram of a current measuring system for an electric vehicle according to a preferred embodiment of the present invention.

Hereinafter, a preferred embodiment of the present invention will be described in detail with reference to the accompanying drawings.

As shown in FIG. 1, a current measuring system according to an embodiment of the present invention comprises a current transducer 200, and a voltage to PWM converter & power supply unit 210. In a preferred embodiment, the current transducer 200 is an open-loop Hall effect current sensor. The current transducer 200 measures the current of the battery and generates a corresponding voltage signal. Preferably, the voltage is proportional to the measured current.

Although a closed-loop current transducer requires bipolar power (e.g., +15 and −15 volts), the open-loop current transducer 200 uses unipolar power (e.g., +7 , +10, or +12 volts). Further, the required power of the open-loop current transducer is relatively small, so it is possible to substantially reduce the size of the circuit. Therefore, the circuit can be implemented as a hybrid IC.

The current measured by the open-loop Hall effect current sensor is bi-directional when the voltage is higher than a predetermined level (2.5V), and is unipolar when the voltage is not higher than the predetermined level because the current is approximately a negative current.

Also, for these reasons, a less complex converter to power the circuitry of the to PWM converter & power supply unit 210 can be utilized. Additionally, the voltage level provided to the PWM converter & power supply unit 210 can be reduced because of the reduced power requirements.

Referring to FIG. 1, the voltage to PWM converter & power supply unit 210 preferably comprises a voltage follower 212, a DC/DC converter 214, a triangle wave generator 216, a voltage level detector 218, and an open collector transistor circuit 220.

The voltage follower 212 transmits the voltage signal of the current transducer 200 to the voltage level detector 218. It also prevents the signal of the current transducer from being distorted by a change of impedance of the measuring circuit. In other words, the voltage follower 212 is used as a buffer between the current transducer 200 and the voltage level detector 218 in order to avoid loading errors. The gain of the voltage follower is approximately 1.0.

The DC/DC converter 214 converts one direct current power level to another direct current power level by changing the intensity of the battery power to a predetermined intensity, in order to supply power to circuit elements. For example, the DC/DC converter 214 provides power to current transducer 200.

The triangle wave generator 216 generates a triangle wave for forming a PWM signal. In order to generate the PWM signal, a reference signal must be compared to the voltage signal input from the current transducer 200. A triangle wave is generally used for this type of signal. Triangle wave generators are well-known in the art, and can be designed using an ASIC (Applicable Specific Integrated Circuit) or a hybrid IC.

The voltage level detector 218 generates a PWM signal by comparing the triangle wave signal to the voltage signal input from the current transducer 200. PWM (Pulse Width Modulation) is a way of digitally encoding analog signal levels. A PWM signal has a repeating series of on and off pulses such that the PWM signal forms a periodic square wave, with the period of the signal being defined as the period of one set of an on pulse and an off pulse. The duty cycle of a PWM signal is defined as the ratio of the on-time to the period. The duty cycle of the PWM signal generated by voltage level detector 218 is modulated to be proportional to the input voltage.

The open-collector transistor circuit 220 transmits the PWM signal to other control units. During this transmission, the open-collector transistor circuit generates an output signal with an open collector, in order to increase compatibility with other control units. In other words, the open collector transistor circuit 220 converts the PWM signal generated in the voltage level detector 218 to a signal that can be used directly in other control units. Also, the output signal is a generalized "logout" type signal in order to be used as the "login" signal of the other control units.

The PWM signal that is generated can be input into a PWM port of a main CPU, and the current can be measured based on the duty changes of the PWM signal. Generally, the main CPU of a vehicle is designed to have the PWM signal input directly, so it can receive the current signal without an additional analog-to-digital converter. Thus, by converting the signal of the current transducer 200 to the PWM signal, and by directly using the PWM signal as a login signal of the CPU, an additional A/D converter, data bus, and control circuit are not necessary.

Also, if the PWM signal is directly connected to an instrument cluster instead of an engine rpm gauge, the power efficiency of the electric vehicle can be directly displayed in the cluster.

In one preferred embodiment of the present invention, the circuits described above are implemented as a single chip, such as a hybrid IC or an ASIC, which can be installed inside the current transducer 200 because of its small size. Therefore, it is possible to make the preferred embodiment as one module.

Additionally, although described as an open-loop Hall effect sensor, the current transducer 200 can also be a closed-loop Hall effect sensor, a shunt resistor sensor, or any other compatible type of sensor that meets noise sensitivity and mechanical interference requirements. However, because the shunt resistor current transducer is not well-suited for a vehicle because it is mounted in an outwardly-exposed state, and because a closed-loop Hall sensor is more expensive than an open-loop Hall sensor, an open-loop sensor is preferable. Regardless of form, the present invention provides a current-measuring system that is robust to both electrical noise and mechanical interference The current-measuring system described above is advantageous because different current transducers for various battery systems of electric vehicles can be used. Also, an additional circuit is not needed for the controller, and the system is compatible with other controllers. In addition, the current-measuring system may utilize an inexpensive sensor.

Although preferred embodiments of the present invention have been described in detail hereinabove, it should be clearly understood that many variations and/or modifications of the basic inventive concepts herein taught which may appear to those skilled in the present art will still fall within the sprit and scope of the present invention, as defined in the appended claims.

What is claimed is:

1. A system for measuring a current of a battery for an electric vehicle, comprising:

a current transducer for measuring the battery current during a charge or a discharge, and for generating a corresponding voltage signal;

a voltage-to-PWM (Pulse Width Modulation) converter for converting the voltage signal generated by the current transducer to a PWM signal; and a power supply unit for supplying power to the current transducer.

2. The system of claim 1, wherein the current transducer is an open-loop Hall effect current sensor.

3. The system of claim 1, wherein the voltage-to-PWM converter and the power supply unit are formed as an integrated circuit (IC), and wherein the IC is installed at least substantially inside the current transducer.

4. The system of claim 1, wherein the voltage to PWM converter comprises:

a triangle wave generator for generating a triangle wave input;

a voltage level detector for generating a PWM signal by comparing the voltage signal generated by the current transducer to the triangle wave input generated by the triangle wave generator; and an open-collector transistor circuit for transmitting the PWM signal to other control units.

5. The system of claim 4, wherein the voltage-to-PWM converter further comprises a voltage follower for transmitting the voltage signal generated by the current transducer to the voltage level detector, the voltage follower preventing the voltage signal of the current transducer from being partially distorted by a change of impedance of the current transducer.

6. The system of claim 1, wherein the power supply unit comprises a DC/DC converter for converting a first power level to a second power level that is directly used by the current transducer, and for supplying the converted second power level to the current transducer.

7. A system for measuring a current of a battery for an electric vehicle, comprising:

a current level detector for measuring battery current during charging and discharging states of the battery, and for generating a corresponding voltage signal, the current level detector using substantially unipolar power;

an analog-to-digital waveform converter for converting the voltage signal generated by the current transducer to a substantially digital waveform;

a power supply unit for supplying unipolar power to the current transducer.

8. The system of claim 7, further comprising an open-collector transistor circuit for transmitting the substantially digital waveform to other control units.

9. The system of claim 7, wherein the current level detector is an open-loop Hall effect current sensor.

10. The system of claim 7, wherein the analog-to-digital waveform converter is a voltage-to-PWM converter.

* * * * *